(12) United States Patent
Yoshimatsu et al.

(10) Patent No.: US 7,564,177 B2
(45) Date of Patent: Jul. 21, 2009

(54) CRYSTAL UNIT HAVING STACKED STRUCTURE

(75) Inventors: Masahiro Yoshimatsu, Saitama (JP); Tamotsu Kurosawa, Saitama (JP); Kozo Ono, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 96 days.

(21) Appl. No.: 11/964,403

(22) Filed: Dec. 26, 2007

(65) Prior Publication Data

US 2008/0150398 A1   Jun. 26, 2008

(30) Foreign Application Priority Data

Dec. 26, 2006   (JP)   ............................. 2006-349911
Aug. 28, 2007   (JP)   ............................. 2007-220478

(51) Int. Cl.
H01L 41/047   (2006.01)
H01L 41/053   (2006.01)

(52) U.S. Cl. ..................... 310/365; 310/340; 310/348; 310/270

(58) Field of Classification Search .............. 310/340, 310/344, 348, 363, 365, 370
See application file for complete search history.

(56) References Cited

U.S. PATENT DOCUMENTS

| | | | | |
|---|---|---|---|---|
| 4,293,986 | A * | 10/1981 | Kobayashi et al. | 29/25.35 |
| 4,362,961 | A * | 12/1982 | Gerber | 310/370 |
| 5,198,716 | A * | 3/1993 | Godshall et al. | 310/349 |
| 5,302,879 | A * | 4/1994 | Totty et al. | 310/361 |
| 5,589,724 | A * | 12/1996 | Satoh et al. | 310/348 |
| 5,596,243 | A * | 1/1997 | Tsuru et al. | 310/348 |
| 5,771,555 | A * | 6/1998 | Eda et al. | 29/25.35 |
| 5,925,973 | A * | 7/1999 | Eda et al. | 310/348 |
| 6,229,249 | B1 * | 5/2001 | Hatanaka et al. | 310/348 |
| 7,352,115 | B2 * | 4/2008 | Sasaki et al. | 310/365 |
| 7,378,776 | B2 * | 5/2008 | Lu | 310/322 |
| 2006/0255691 | A1 * | 11/2006 | Kuroda et al. | 310/348 |
| 2007/0058003 | A1 * | 3/2007 | Aoki | 347/68 |

FOREIGN PATENT DOCUMENTS

| | | | |
|---|---|---|---|
| JP | 8-204479 | | 8/1996 |
| JP | 11-103230 | * | 4/1999 |
| JP | 2000-77942 | | 3/2000 |
| JP | 2000-269775 | | 9/2000 |
| JP | 2001-119263 | | 4/2001 |

* cited by examiner

*Primary Examiner*—Thomas M Dougherty
(74) *Attorney, Agent, or Firm*—Katten Muchin Rosenman LLP

(57) ABSTRACT

A stacked crystal unit includes: a first crystal plate in which a vibration member links to an outer circumferential frame portion, and a pair of extending electrode extends to the frame portion from excitation electrodes; and a second and third crystal plates which have a concave portion in an area opposite to the vibration member and whose open end surfaces are joined by direct bonding to both principal surfaces of the frame portion in the first crystal plate. The extending electrodes are electrically extended to an outer surface of at least one of the second and third crystal plates via electrode through-holes provided in the frame portion. The electrode through-hole includes: a first electrode through-hole penetrating through the frame portion from the principal surface of the frame portion where the extending electrode extends; and a second electrode through-hole provided in the second or third crystal plate.

7 Claims, 6 Drawing Sheets

CRYSTAL UNIT HAVING STACKED STRUCTURE

BACKGROUND OF THE INVENTION

1. Field of the Invention

The present invention relates to a crystal unit having a stacked structure in which a plurality of crystal plates are joined to each other by direct bonding, and particularly to a configuration for extending an electrode to an outer surface of a crystal unit.

2. Description of the Related Art

A crystal unit having a configuration in which a vibration member formed by a quartz crystal plate is hermetically encapsulated in a package is known as a frequency control device, and is incorporated in an oscillation circuit and a tuning circuit in various electronic apparatuses. As electronic apparatuses have recently been miniaturized, the crystal unit also is required to be miniaturized and simplified in configuration, and accordingly, there has been proposed a crystal unit having a stacked structure in which crystal plates are joined to each other by direct bonding using, for example, siloxane bond. A crystal unit having such a stacked structure is also called a stacked crystal unit. Such a stacked crystal unit is disclosed, for example, in Japanese Patent Laid-Open Application Nos. 8-204479 (JP-A-8-204479), Japanese Patent Laid-Open Application No. 2000-269775 (JP-A-2000-269775), and Japanese Patent Laid-Open Application No. 2001-119263 (JP-A-2001-119263).

FIG. 1A is a plan view of a conventional stacked crystal unit, and FIG. 1B a cross-section view taken along line A-A in FIG. 1A.

Concerning quartz crystal, three crystallographic axes X, Y and Z are generally defined based on crystallography. Description will be hereinafter provided using the crystallographic axes defined crystallographically.

A crystal unit shown is configured in a manner that second and third quartz crystal plates 1b and 1c are directly bonded to both principal surfaces of first quartz crystal plate 1a so that orientations of individual crystallographic axes coincide with each other. First crystal plate 1a functions as a vibration member, and includes, for example, crystal blank 2 having a shape of a tuning-fork, and has a configuration that a bottom surface of tuning-fork base portion 2a is linked or connected to outer circumferential frame portion 3 through the intervention of protruding bar 3a. Here, it is assumed that the longitudinal direction of tuning-fork-like crystal blank 2 coincides with a Y axis, its width direction coincides with an X axis, and its thickness direction coincides with a Z axis. Such tuning-fork-like crystal blank 2 vibrates in piezoelectric vibration of tuning-fork vibration mode. On tuning-fork arms 2b of tuning-fork-like crystal blank 2, a pair of excitation electrodes (not shown) are formed, and first and second extending electrodes 4a and 4b connected to the excitation electrodes extend from one principal surface of first crystal plate 1a in tuning-fork base portion 2a to electrode pads 4x and 4y on both end portions through a surface of frame portion 3.

Second and third crystal plates 1b and 1c function as a cover for the vibration member, that is, a vibration region, of first crystal plate 1a, and both have a concave portion in an area opposite to the vibration member (i.e., tuning-fork-like crystal blank 2). Then, to both principal surfaces of frame portion 3 in first crystal plate 1a, open end surfaces to form outer circumferential portions of the concave portions in second and third crystal plates 1b and 1c are joined by direct bonding. Direct bonding is processing that mirror polished surfaces are hydrophilized, specifically, the surfaces are modified with a hydroxyl group (—OH group), and subsequently, the surfaces are made opposite to each other and heated while being pressed, thereby siloxane (Si—O—Si) bond is formed between both crystal plates, which bonds both crystal plates to each other.

Then, for example, on an outer circumstantial portion of both end portions of an outer surface of second crystal plate 1b, there is provided a pair of external terminals 5 used for surface-mounting the crystal unit on a wiring board. The pair of external terminals 5 is electrically connected to electrode pads 4x and 4y to which first and second extending electrodes 4a and 4b of first crystal plate 1a extend via electrode through-holes 6 provided in both end portions of second crystal plate 1b. Electrode through-hole 6 is formed by filling a through-hole provided in advance with material fitted for quartz, for example, conductive paste containing chromium (Cr), and subsequently burning or sintering. This electrically connects electrode pads 4x and 4y to external terminals 5, respectively, and hermetically seals the through-holes. That is, a via-hole is formed.

Such a crystal unit has three components, that is, first to third crystal plates 1a to 1c, so that its configuration is simplified, and the crystal unit can be formed in a small size. Further, the orientations of the three crystallographic axes X, Y and Z of first to third crystal plates 1a to 1c coincide with each other, and therefore the crystal plates have a similar thermal expansion coefficient, which provides better aging characteristics against change in temperature.

In the crystal unit having the configuration described above, electrode pads 4x and 4y of extending electrodes 4a and 4b extending to frame portion 3 of first crystal plate 1a are extended through the via-holes (i.e., electrode through-holes 6) of second crystal plate 1b, and connected to external terminals 5 on second crystal plate 1b. In this case, frame portion 3 of first crystal plate 1a is directly bonded to the outer circumference of second crystal plate 1b, but first and second extending electrodes 4a and 4b, and electrode pads 4x and 4y are basically bonded directly to neither first crystal plate 1a nor second crystal plate 1b. As the result, for example as shown in FIG. 2, on a bonded interface between the crystal plates, there are produced gaps around first and second electrode pads 4x and 4y due to an electrode film thickness of electrode pads 4x and 4y including first and second leading electrodes 4a and 4b, dependent on the corresponding electrode film thickness. Then, airtightness of the crystal unit is maintained basically by electrode through-holes 6 formed as via-holes.

However, it is thought that the via-hole serving as electrode through-hole 6 is formed of a sintered member of chromium, and the via-hole is not integrated with quartz crystal by interatomic bond, and does not necessarily provide reliable air sealing, dependent on manufacture conditions and the like. Then, electrode through-holes 6 are provided only in second crystal plate 1b, and as the crystal unit becomes increasingly lower in height, a sealing path length is shorter between filling material (e.g., chromium) and a side wall of the crystal plate at the position of the electrode through-hole. Accordingly, there has been a problem that it was difficult to secure airtightness, and the vibration member was susceptible to an effect of external environments.

In addition, in a crystal unit using a package made of ceramics other than quartz crystal, measures to improve airtightness of a via-hole are disclosed in Japanese Patent Laid-Open Application No. 2000-77942 (JP-A-2000-077942).

SUMMARY OF THE INVENTION

An object of the present invention is to provide a crystal unit which is formed by stacking crystal plates with direct bonding and in which airtightness is secured.

An object of the present invention is achieved by a crystal unit including: a first crystal plate in which a vibration member with excitation electrodes provided thereon links to an outer circumferential frame portion, and a pair of extending electrodes extends from the excitation electrodes to the frame portion; and a second and third crystal plates which have a concave portion in an area opposite to the vibration member and whose open end surfaces are joined by direct bonding to both principal surfaces of the frame portion in the first crystal plate, wherein the extending electrodes are extended to an outer surface of at least one of the second and third crystal plates via electrode through-holes formed of via-holes provided in the frame portion, and electrically connected to external terminals formed on the outer surface, and wherein the electrode through-hole in the frame portion includes: a first electrode through-hole penetrating through the frame portion from the principal surface of the frame portion where the extending electrode extends; and a second electrode through-hole provided in at least one of the second and third crystal plates.

According to such configuration, the first and second electrode through-holes are formed in the first crystal plate and at least one of the second and third crystal plate, and a sealing path formed by the electrode through-holes can be prolonged. Therefore, airtightness of the crystal unit can be secured.

In the crystal unit of the present invention, the first and second electrode-through-holes may be formed at different positions of the first crystal plate, and the second or third crystal plate to have a shape of crank. When forming in a shape of crank can maintain air sealing of at least either the first electrode through-hole or the second electrode through-hole, airtightness is secured. In this case, the first electrode through-hole provided in the first crystal plate can be formed of a third and fourth electrode through-holes provided at different positions. Configuring the first electrode through-hole by the third and fourth electrode through-holes provides three electrode through-holes in total, and thereby airtightness can be more easily secured.

Alternatively, in the crystal unit of the present invention, the first and second electrode through-holes may be formed respectively at a corresponding position in the first crystal plate and the second or third crystal plate, and linearly-arranged. In the case of the linear arrangement, all that is required is one filling process of conductive paste from an outer surface of the second or third crystal plate for forming the via-holes, after directly bonding the first to third crystal plates to each other. In this case, the first and second electrode through-holes may be made different in diameter from each other. Different diameter makes it easy to align the first through-hole with the second through-hole when directly bonding the first crystal plate to, for example, the second crystal plate in which the first and second through-holes are provided, respectively.

The crystal unit of the present invention may be encapsulated with resin except a metal plate serving as a mounting terminal connected to the external terminal. In this case, because the crystal plate itself, which is fragile material, is not exposed externally, the crystal unit can be prevented from being damaged or broken.

DETAILED DESCRIPTION OF THE PREFERRED EMBODIMENT

First Embodiment

Figure 1A:
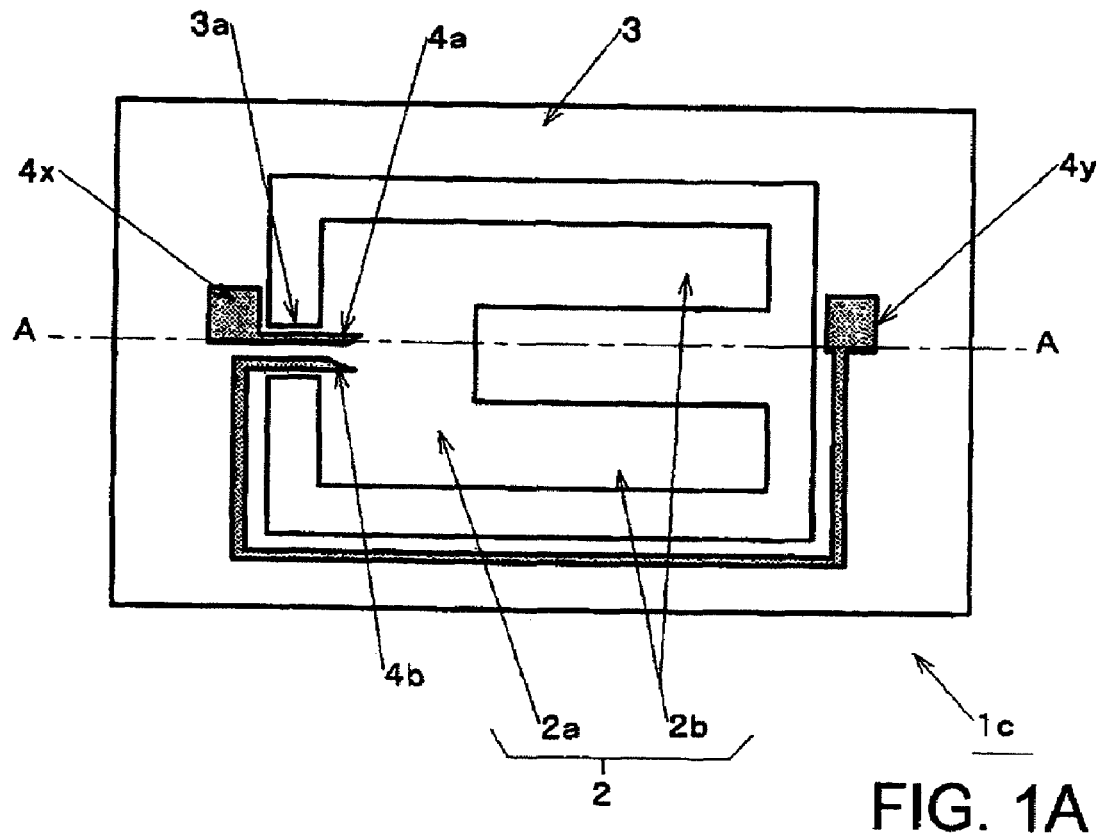
FIG. 1A is a plan view illustrating a conventional crystal unit.
Figure 1B:
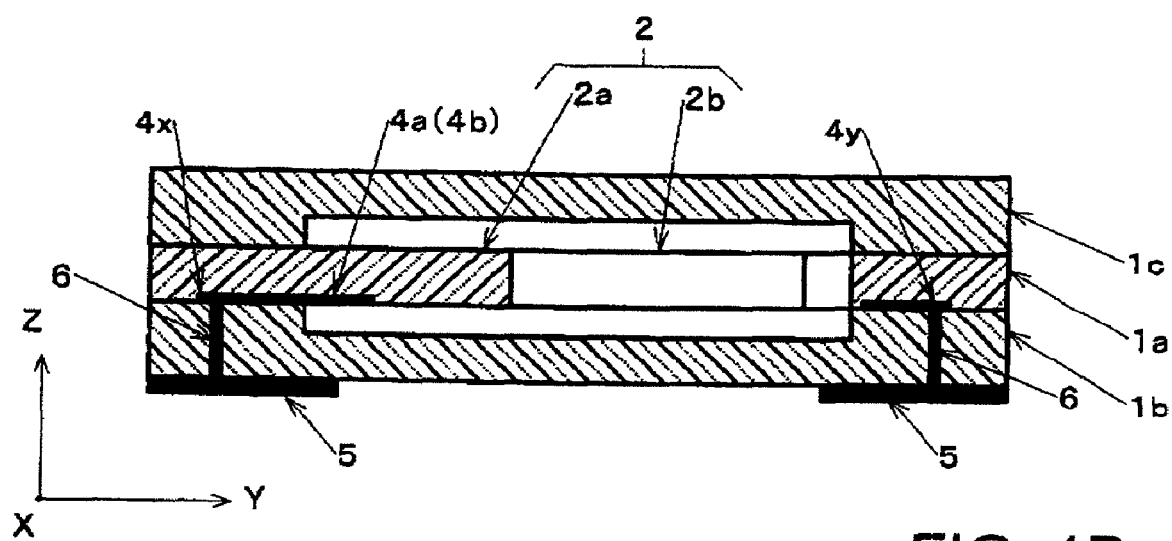
FIG. 1B is a cross-section view taken along line A-A in FIG. 1A.
Figure 2:
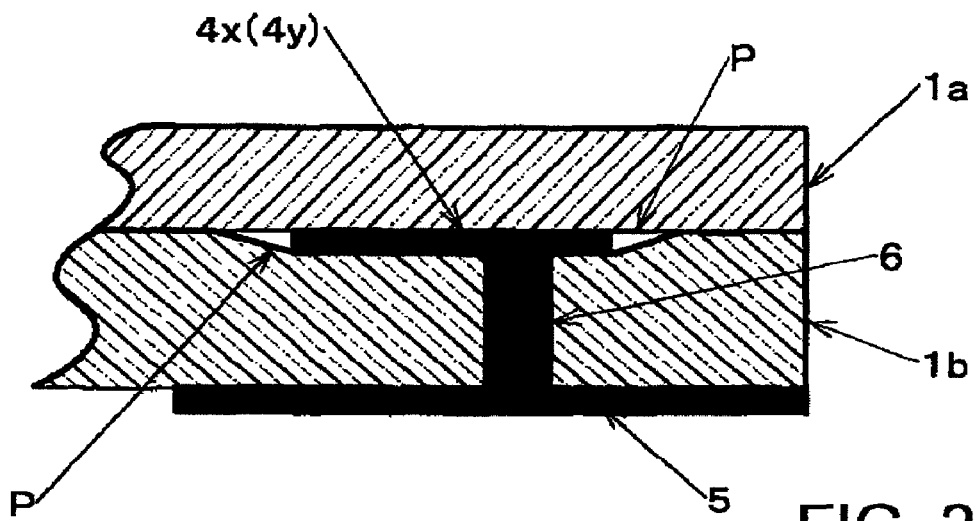
FIG. 2 is a partial, enlarged view of the conventional crystal unit.
Figure 3:
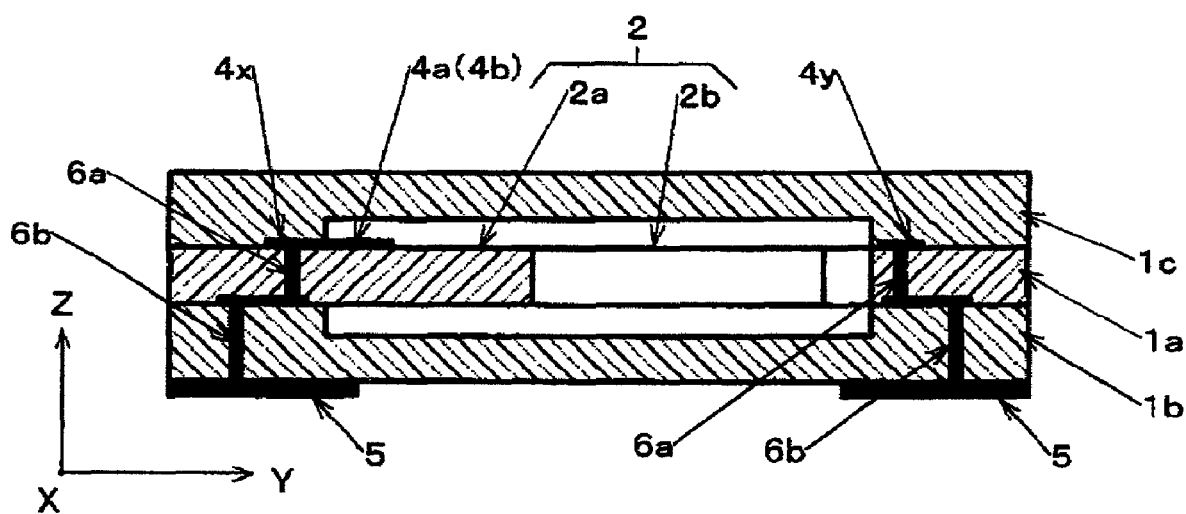
FIG. 3 is a cross-section view illustrating a crystal unit according to a first embodiment of the present invention.
Figure 4A:
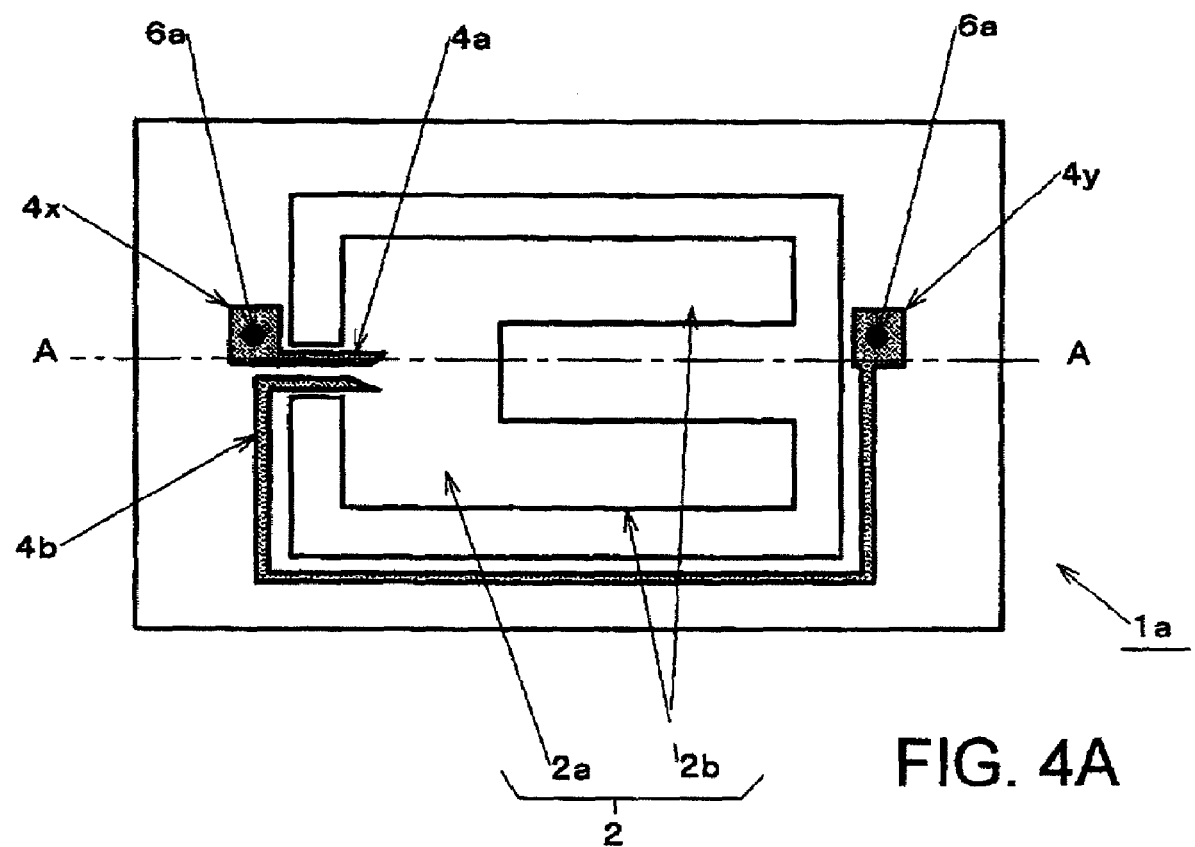
FIG. 4A is a plan view illustrating a first crystal plate of the crystal unit shown in FIG. 3.
Figure 4B:
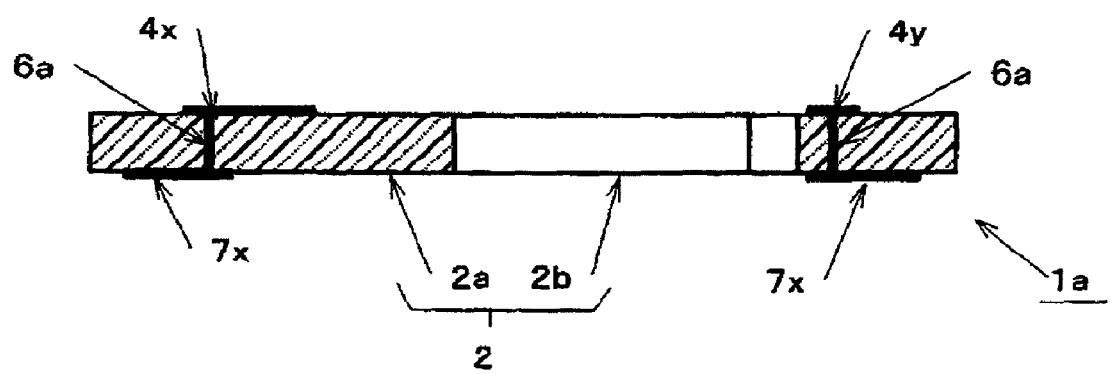
FIG. 4B is a cross-section view taken along line A-A in FIG. 4A.

In FIGS. 3, 4A and 4B illustrating a crystal unit of a first embodiment of the present invention, same reference symbols will be given to the same components as in FIGS. 1A, 1B and 2 to avoid or simplify redundant explanations.

A crystal unit according to the first embodiment, as described above, includes: first quartz crystal plate 1a including a vibration member and frame portion 3 to which the vibration member links; and second and third quartz crystal plates 1b and 1c each of which functions as a cover for the vibration member. Each of second and third crystal plates 1b and 1c has a concave portion in an area opposite to the vibration member. Then, to both principal surfaces of frame portion 3 in first crystal plate 1a, open end surfaces to form outer circumferential portions of the concave portions in second and third crystal plates 1b and 1c are joined by direct bonding. As the vibration member, first crystal plate 1a has tuning-fork-like crystal blank 2 as described above. Then, first and second extending electrodes 4a and 4b connected to a pair of excitation electrodes (not shown) provided on tuning-fork arm 2b extend as electrode pads 4x and 4y to one end side and the other side of frame portion 3, through one principal surface of tuning-fork base portion 2a and protruding bar 3a.

Electrode pads 4x and 4y are respectively connected to electrode pads 7x and 7y provided on the other principal surface of first crystal plate 1a via first electrode through-holes 6a formed of via-holes. Positions where first electrode through-holes 6a are formed are respectively near an inner circumference of the frame portion. Electrode pads 7x and 7y are formed to extend from positions corresponding to first electrode through-holes 6a to near an outer circumference, and connected to external terminals 5 provided on an outer surface of second crystal plate 1b via second electrode through-holes 6b formed of via-holes. Second electrode through-holes 6b are formed on one end side and the other end side of an outer portion of second crystal plate 1b, and formed to be separated from first electrode through-holes 6a and positioned near the outer circumference.

First and second electrode through-holes 6a and 6b both are positioned in an area where first and second crystal plates 1a and 1b are bonded to each other, which results in, in a bonded area of the crystal plates, providing first and second electrode through-holes 6a and 6b formed in a shape of crank in first and second crystal plates 1a and 1b. Therefore, first and second extending electrodes 4a and 4b are extended to the outer surface of second crystal plate 1b via first and second electrode through-holes 6a and 6b formed in a shape of crank. Electrode through-holes 6a and 6b are respectively connected to external terminals 6.

Next, manufacturing processes of this crystal unit will be described with reference to FIG. 5.

First, in first crystal plate 1a, the excitation electrodes (not shown) are formed, and electrode pads 4x and 4y of first and second extending electrodes 4a and 4b extending from one principal surface of the base portion are formed on one end side and the other end side of frame portion 3. These are integrally formed when an outline of a quartz crystal wafer is processed by etching using a photolithography technique to form first crystal plate 1a. Alternatively, after the outline processing of first crystal plate 1a, these are formed by vacuum deposition or sputtering. Each of these electrodes is formed, for example, by providing chromium as an underlining electrode and on it, plating gold (Au).

Figure 5:
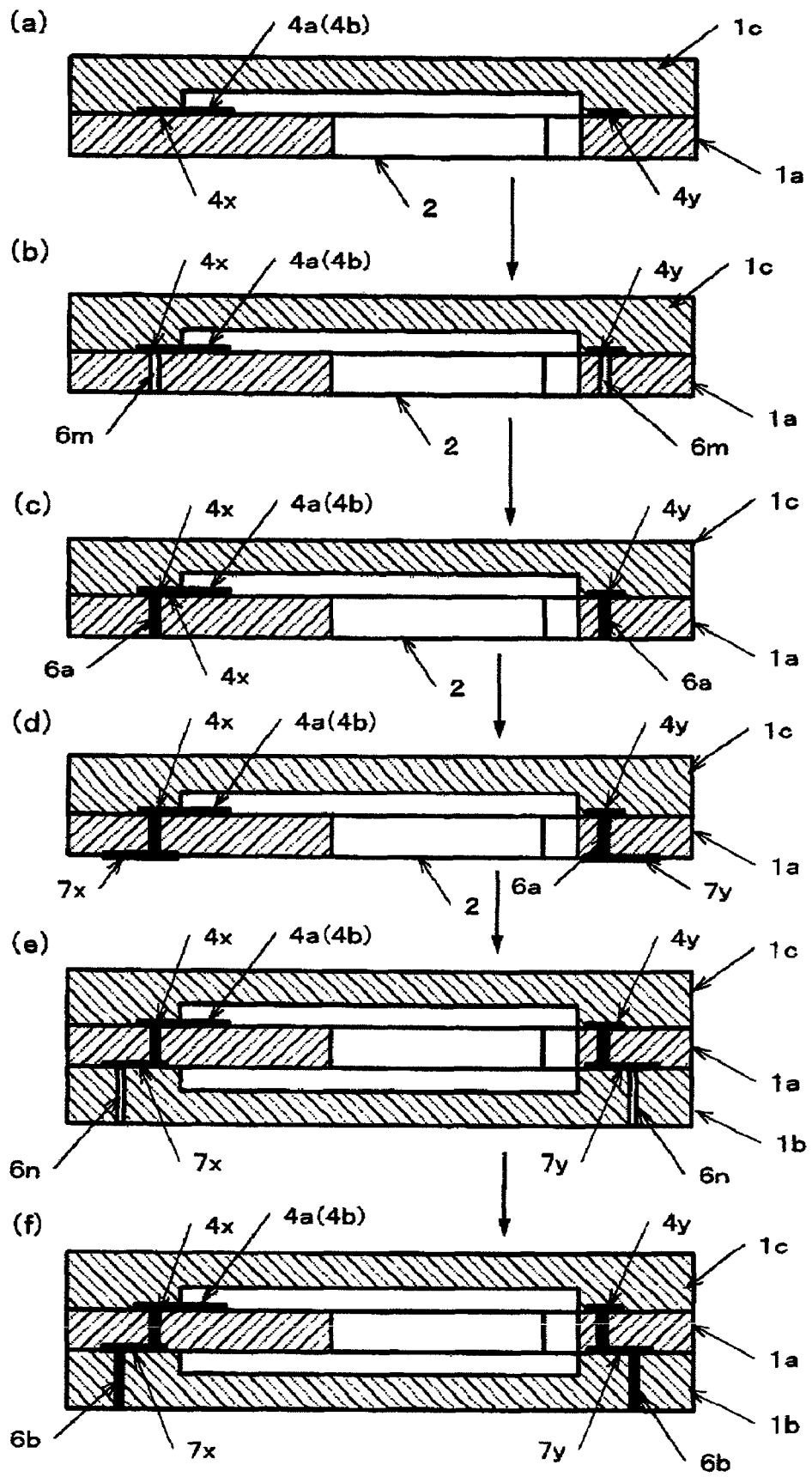
FIG. 5 is a cross-section view illustrating manufacture processes of the crystal unit shown in FIG. 3.

Next, as shown process (a) in FIG. 5, to one principal surface of first crystal plate 1a, third crystal plate 1c is joined by direct bonding. Then, as shown in process (b), first through-hole 6m is formed in first crystal plate 1a by etching. At this time, for an etchant, fluorinated acid is used, and as the result, gold is not etched and only first through-hole 6m is formed in first crystal plate 1a. Alternatively, using a well-known dry etching technique, through-hole 6m is formed. Then, as shown in process (c), through-hole 6m is filled with conductive paste composed of chromium, and sintered to form first electrode through-hole 6a formed of the via-hole. Accordingly, first electrode through-hole 6a is connected to each of electrode pads 4x and 4y on the both end portions of one principal surface of first crystal plate 1a. Then, as shown in process (d), electrode pads 7x and 7y near the outer circumference are formed to be connected to first electrode through-holes 6a exposed on the other principal surface of first crystal plate 1a by a method such as vacuum deposition.

Next, as shown in process (e) in FIG. 5, to the other principal surface of first crystal plate 1a, second crystal plate 1b is joined by direct bonding. In both end portions of second crystal plate 1b, second through-holes 6n are formed in advance by etching before directly bonding. Then, as shown in process (f), similarly to the described above, second through-holes 6n are filled with conductive paste and sintered to form second electrode through-holes 6b. Finally, on the outer surface of second crystal plate 1b, that is, an outer bottom surface of the crystal unit, underlining electrodes are provided by a method such as vacuum deposition and the underlining electrodes are plated with gold, and thereby external terminals 5 are formed. This results in a completed crystal unit shown in FIG. 3.

In this crystal unit, within an area where first and second crystal plates 1a and 1b are bonded to each other, extending electrodes 4a and 4b of first crystal plate 1a are extended to the outer surface of second crystal plate 1b via first and second electrode through-holes 6a and 6b formed on first and second crystal plates 1a and 1b, and connected to external terminals 5. Accordingly, compared to the case where the electrode through-hole is formed only in second crystal plate 1b as the crystal unit shown in FIGS. 1A, 1B and 2, the sealing path of electrode through-holes 6 can be prolonged, so that a leakage of air sealing can be more unfailingly prevented.

Further, first and second electrode through-holes 6a and 6b are formed at different positions in first and second crystal plates 1a and 1b. Accordingly, even ff there is a leakage of air sealing, for example, in first electrode through-hole 6a or second electrode through-hole 6b, airtightness of the crystal unit can be unfailingly secured due to reliable air sealing in any one of electrode through-holes 6a and 6b.

Second Embodiment

Figure 6:
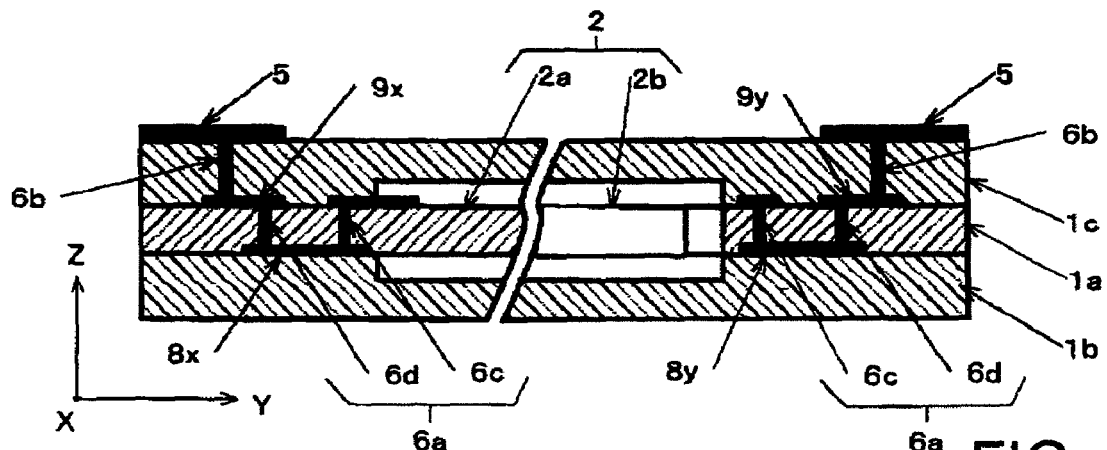
FIG. 6 is a cross-section view illustrating a crystal unit according to a second embodiment of the present invention.

FIG. 6 shows, in a cross-section view, a configuration especially of both end portions of a crystal unit of a second embodiment of the present invention.

In the crystal unit of the second embodiment, each of first electrode through-holes 6a on both end portions of one principal surface of first crystal plate 1a, that is, the vibrating member, to which a pair of extending electrodes 4a and 4b extend, is formed of third and fourth electrode through-holes 6c and 6d provided adjacent to each other in first crystal plate 1a. Then, on the other principal surface side of first crystal plate 1a, third and fourth electrode through-holes 6c and 6d are electrically connected to each other via electrode pads 8x and 8y and the like including an electrically conducting path. Fourth electrode through-hole 6d is connected to second electrode through-hole 6b provided in third crystal plate 1c via electrode pads 9x and 9y. Second electrode through-hole 6b is connected to external terminal 5 provided on an outer surface of third crystal plate 1c.

Next, a manufacture method of the crystal unit of the second embodiment will be described.

For example, first, in one principal surface of first crystal plate 1a, the electrode pads electrically connected to third and fourth electrode through-holes 6c and 6d are respectively formed, and subsequently, third and fourth through-holes are formed in first crystal plate 1a by etching from the other principal surface side. Then, the third and fourth through-holes are filled with conductive paste and sintered to form third and fourth electrode through-holes 6c and 6d. Next, on third and fourth electrode through-holes 6c and 6d exposed on the other principal surface side of first crystal plate 1a, metal films, for example, chromium films as electrode pads 8x and 8y are provided by vacuum deposition and the like to electrically connect third and fourth electrode through-holes 6c and 6d to each other.

Next, to both principal surfaces of first crystal plate 1a, second and third crystal plates 1b and 1c are joined by direct bonding, respectively. In each of both end portions of third crystal plate 1c, a second through-hole is formed in advance. This exposes electrode pad 9x in second through-hole provided on one principal surface of first crystal plate 1a and electrically connected to fourth electrode through-hole 6d. Then, the second through-hole is filled with conductive paste and sintered to form second electrode through-hole 6b. Finally, on second electrode through-hole 6b exposed on the outer surface of third crystal plate 1c, external terminal 5 is formed by vacuum deposition and the like.

In the crystal unit of the second embodiment, first electrode through-hole 6a provided in first crystal plate 1a is composed of third and fourth electrode through-holes 6c and 6d, and extending electrodes 4a and 4b are extended to an outer surface of the crystal unit via three electrode through-holes 6b, 6c and 6d. Accordingly, the sealing path length in the electrode through-holes can be more prolonged than the case of the first embodiment, and any of the second to fourth electrode through-holes is hermetically sealed, thereby airtightness of the crystal unit can be unfailingly maintained.

Third Embodiment

Figure 7:
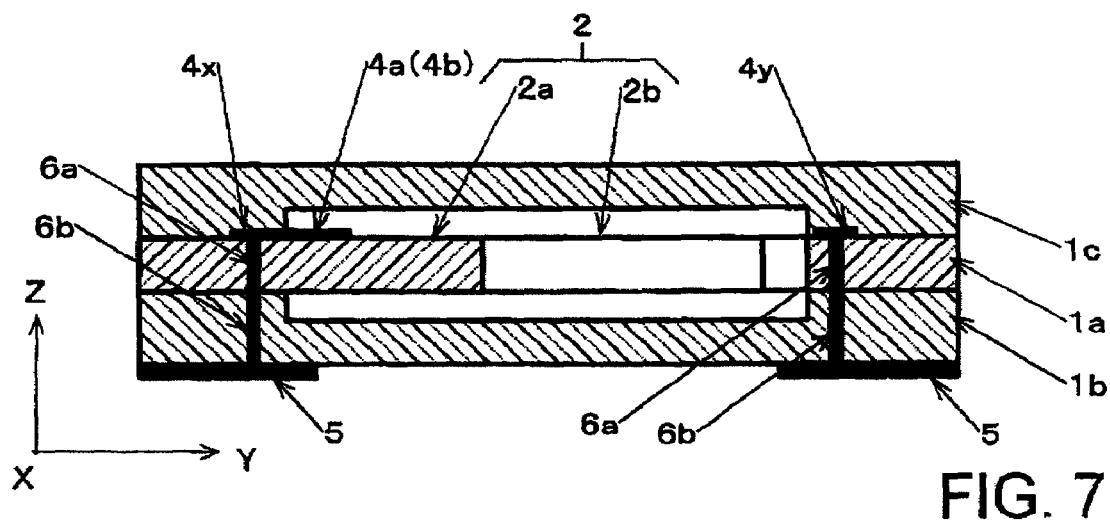
FIG. 7 is a cross-section view illustrating a crystal unit according to a third embodiment of the present invention.

A crystal unit of a third embodiment shown in FIG. 7 is similar to that of the first embodiment, but it is a different from the crystal unit of the first embodiment in that first electrode through-hole 6a provided in first crystal plate 1a and, for example, second electrode through-hole 6b provided in second crystal plate 1b are arranged to be connected to each other in alignment. Extending electrodes 4a and 4b are extended to the outer surface of second crystal plate 1b through these electrode through-holes 6a and 6b, and connected to external terminals 5 provided on the outer surface of second crystal plate 1b.

Next, a manufacture method of the crystal unit will be described.

First, second and third crystal plates 1b and 1c are joined by direct bonding to first crystal plate 1a in which the excitation electrodes are formed and which has, for example, electrode pads 4x and 4y extending from extending electrodes 4a and 4b on one end side and the other end side of one principal surface. Then, in both end portions of an outer surface of second crystal plate 1b, through-holes are formed by etching to expose each of electrode pads 4x and 4y on first crystal plate 1a.

Alternatively, first, third crystal plate 1c is joined by direct bonding to one principal surface of first crystal plate 1a in which the electrode pads are formed. Then, through-holes are formed from the other principal surface side of first crystal plate 1a to expose electrode pads 4x and 4y. Next, second crystal plate 1b in which the through-holes are provided is joined by direct bonding to the other principal surface of first crystal plate 1a, and the first and second through-holes are linearly arranged to expose electrode pads 4x and 4y.

After exposing electrode pads 4x and 4y, the first and second through-holes linearly formed are filled with conductive paste and sintered to form first and second electrode through-holes 6a and 6b to be connected to each other in alignment. Then, by vacuum deposition and the like, on second electrode through-hole 6b exposed on an outer surface of second crystal plate 1b, external terminal 5 is formed.

Also in the third embodiment, because first electrode through-hole 6a is formed in first crystal plate 1a to allow the sealing path length of the electrode through-holes to be prolonged, airtightness of the crystal unit can be more unfailingly secured. Since, electrode through-holes 6a and 6b are linearly arranged on first and second crystal plates 1a and 1b, a filling work of conductive paste can end by one time, simplifying the manufacture process.

Fourth Embodiment

Figure 8:
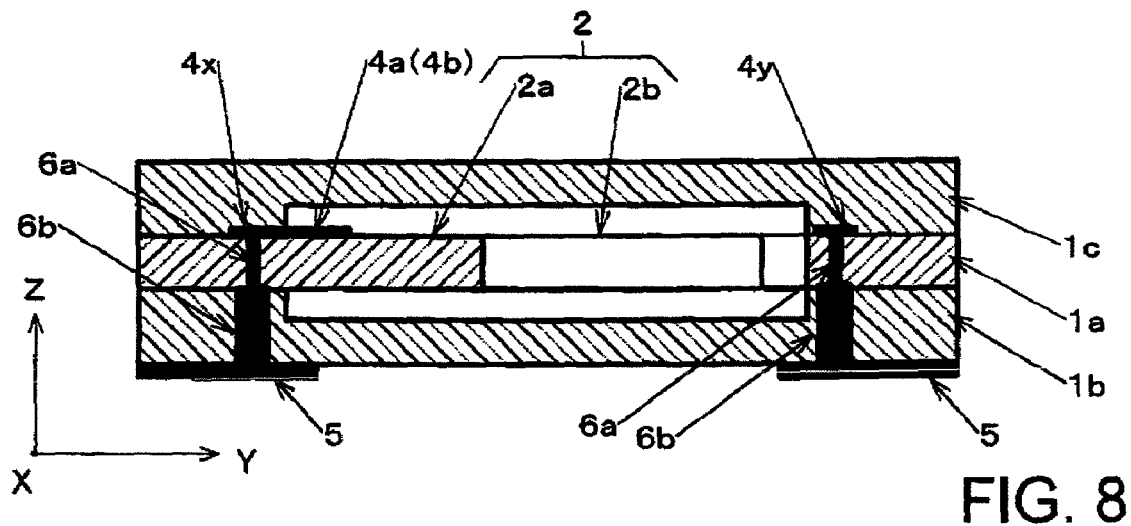
FIG. 8 is a cross-section view illustrating a crystal unit according to a fourth embodiment of the present invention.

A crystal unit of a fourth embodiment shown in FIG. 8 has diameters made different from each other of first and second electrode through-holes 6a and 6b formed in first and second crystal plates 1a and 1b, in the crystal unit of the third embodiment. For example, the diameter of second electrode through-hole 6b provided in second crystal plate 1b is made larger than the diameter of the first electrode through-hole provided in first crystal plate 1a. Then, when first and second crystal plates 1a and 1b are joined by direct bonding to each other, these through-holes can be positioned to absorb position errors of the first and second through-holes, and linearly arrange them to the degree sufficient to fill with conductive paste by one time.

Figure 9:
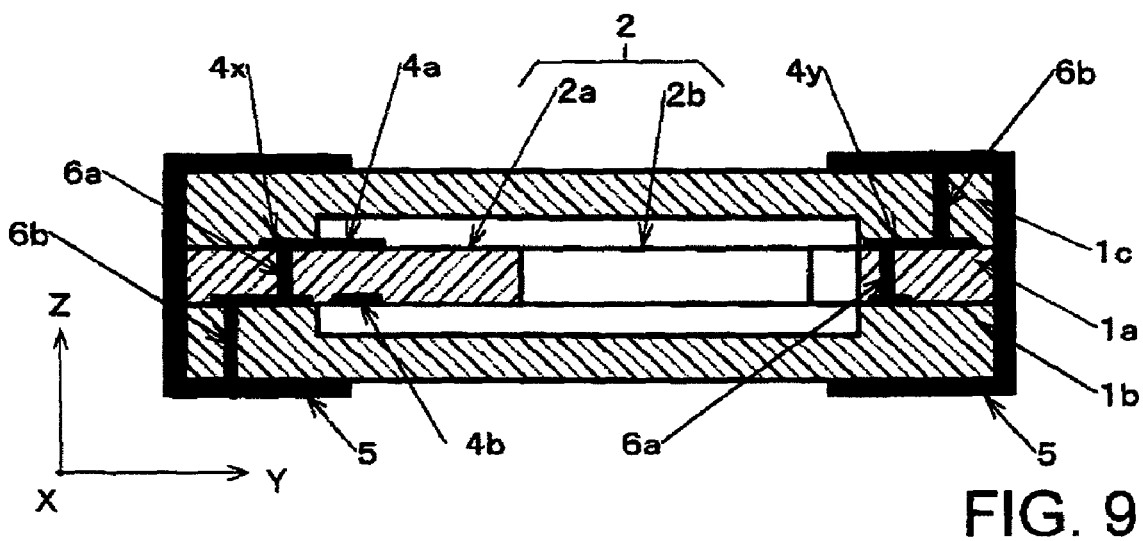
FIG. 9 is a cross-section view illustrating a crystal unit according to another embodiment of the present invention.

In the embodiments described above, each of the electrode pads extending from the pair of extending electrodes 4a and 4b is formed on one principal surface of first crystal plate 1a. However, the present invention can be also applied, for example, to the case where each of extending electrodes 4a and 4b is respectively formed on both end portions of both principal surface of first crystal piece 1a. In this case, for example as shown in FIG. 9, the electrode through-hole is formed by etching from the direction of the surface opposite to the surface on which each electrode pad is formed, and this extends extending electrodes 4a and 4b to respective outer surfaces of second and third crystal plates 1b and 1c. Extending electrodes 4a and 4b are extended to the opposite direction to each other, and corresponding to this, in this crystal unit, external terminals 5 for surface-mounting are formed on both end portions of the crystal unit, on a side surface and all surfaces of an upper and lower surfaces shown.

Also, in the first and second embodiments, first and second electrode through-holes 6a and 6b have been positioned to be shifted from each other in the longitudinal direction of the crystal unit in the central regions of both end portions of first crystal plate 1a, but first and second electrode through-holes 6a and 6b may be positioned to be shifted from each other in the width direction of the crystal unit, that is, the direction perpendicular to the longitudinal direction. Whether first and second electrode through-holes 6a and 6b are arranged in the longitudinal direction of the crystal unit or the width direction may be suitably selected based on a size of the crystal unit and easiness to form the via-holes.

In each of the embodiments described above, there has been provided description of the case where the vibration member of first crystal plate 1a was tuning-fork-like crystal blank 2, but the present invention is not limited to this. For example, for the vibration member, an AT-cut, flat quartz crystal blank may be used. The AT-cut crystal blank vibrates in piezoelectric vibration of thickness-shear mode. What kind of piezoelectric vibration modes in which a crystal piece constituting the vibration member vibrates may be suitably determined dependent on application and the like of the crystal unit and the like.

Figure 10A:
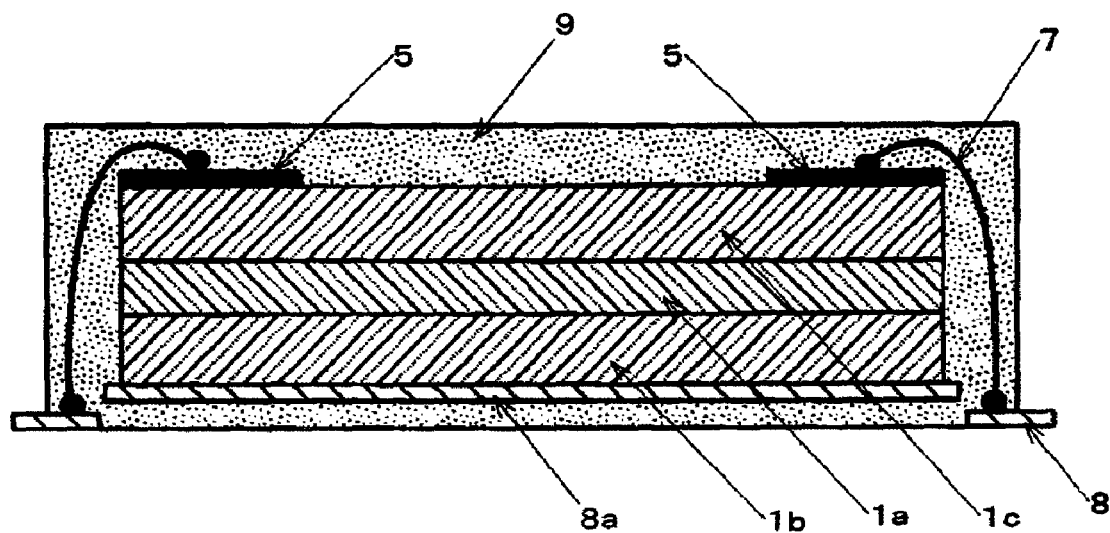
FIGS. 10A and 10B are cross-section views illustrating crystal units of still another embodiment of the present invention.
Figure 10B:
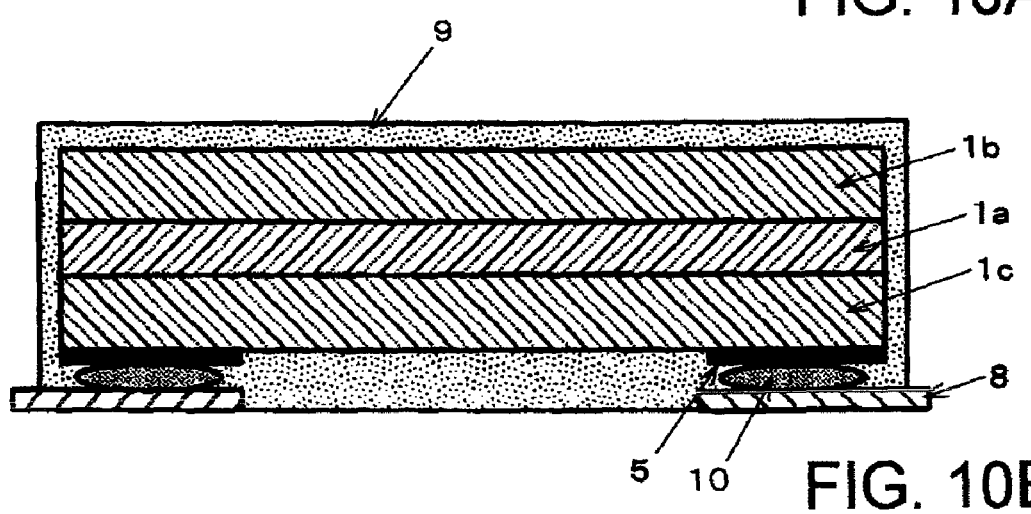

The crystal unit described above has the outer surface composed of a crystal plate except the positions where external terminals 5 are formed. Quartz crystal is fragile material compared to ceramics and plastics, and prone to generate a crack and the like when mechanical impact is applied. Then, as shown in FIGS. 10A and 10B, the crystal unit configured by stacking first to third crystal plates 1a to 1c may be entirely encapsulated with resin 9 to prevent damage and the like. For example, as shown in FIG. 10A, external terminal 5 of the crystal unit is connected to metal plate 8 serving as a mounting terminal through conductor 7 wired by wire bonding, and only exposing this metal plate 8, the crystal unit may be entirely encapsulated with resin 9. In this case, on a bottom surface of the crystal unit, auxiliary plate 8a is provided to raise the level of the bottom surface. Metal plate 8 and auxiliary plate 8a are connected in advance to a frame (not shown), and after encapsulation with resin 9, cut off from the frame.

Alternatively, external terminal 5 of the crystal unit is bonded to metal plate 8, which is connected to a frame (not shown), by thermal compression bonding using bump 10 and the like, and the crystal unit is encapsulated with resin 9.

Then, after encapsulation with resin 9, metal plate 8 is cut off from the frame. FIG. 10B shows the crystal unit configured by such a way.

Because of encapsulating entirely the crystal unit with resin, the outer surfaces of the crystal plate are not exposed externally, and thereby the crystal plates can be protected and prevented from damage and the like.

What is claimed is:

1. A crystal unit, comprising:
   a first crystal plate in which a vibration member with excitation electrodes provided thereon links to an outer circumferential frame portion, and a pair of extending electrodes extends from the excitation electrodes to the frame portion; and
   a second and third crystal plates which have a concave portion in an area opposite to the vibration member and whose open end surfaces are joined by direct bonding to both principal surfaces of the frame portion in the first crystal plate,
   wherein the extending electrodes are extended to an outer surface of at least one of the second and third crystal plates via electrode through-holes formed of via-holes provided in the frame portion, and electrically connected to external terminals formed on the outer surface, and
   wherein the electrode through-hole in the frame portion includes:
   a first electrode through-hole penetrating through the frame portion from the principal surface of the frame portion where the extending electrode extends; and
   a second electrode through-hole provided in at least one of the second and third crystal plates.

2. The crystal unit according to claim 1, wherein the first and second electrode through-holes are formed at different positions of the first crystal plate and the second or third crystal plate to have a shape of crank.

3. The crystal unit according to claim 2, wherein the first electrode through-hole provided in the first crystal plate is composed of a third and fourth electrode through-holes provided at different positions, each of the third and fourth electrode through-holes electrically connecting both principal surface of the first crystal plate.

4. The crystal unit according to claim 1, wherein the first and second electrode through-holes are formed at corresponding positions of the first crystal plate, and the second or third crystal plate, respectively, to have a linear shape.

5. The crystal unit according to claim 4, wherein the first electrode through-hole and the second electrode through-hole are different in diameter.

6. The crystal unit according to claim 1, wherein the crystal unit is encapsulated with resin except a metal plate serving as a mounting terminal connected to the external terminal.

7. The crystal unit according to claim 1, wherein each of the electrode through-hole is filled with chromium.

* * * * *